(12) United States Patent
Vagher et al.

(10) Patent No.: US 7,570,111 B1
(45) Date of Patent: Aug. 4, 2009

(54) APPARATUS AND METHOD FOR WIDEBAND AMPLIFICATION OF RF SIGNALS

(75) Inventors: Michael Vagher, Cedar Rapids, IA (US); Peter Tilly, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 67 days.

(21) Appl. No.: 11/824,051

(22) Filed: Jun. 28, 2007

(51) Int. Cl.
*H03F 3/68* (2006.01)
(52) U.S. Cl. ...................... 330/126; 330/295
(58) Field of Classification Search ........... 330/126, 330/302; 375/297; 455/127.1, 91
See application file for complete search history.

(56) References Cited

U.S. PATENT DOCUMENTS

| 6,188,877 | B1 * | 2/2001 | Boesch et al. ............... 455/74 |
| 2004/0192233 | A1 * | 9/2004 | Mitzlaff .................. 455/127.1 |

* cited by examiner

*Primary Examiner*—Robert Pascal
*Assistant Examiner*—Hieu P Nguyen
(74) *Attorney, Agent, or Firm*—Daniel M. Barbieri (57) ABSTRACT

The present invention is directed to an apparatus and method for wideband amplification of RF signals. A wideband amplification apparatus in accordance with the present invention may comprise: (a) a high-band amplifier; (b) a low-band amplifier; (c) a quadrature hybrid; and (d) a plurality of antennas.

16 Claims, 6 Drawing Sheets

APPARATUS AND METHOD FOR WIDEBAND AMPLIFICATION OF RF SIGNALS

FIELD OF THE INVENTION

The present invention relates to the field of radio frequency RF transmissions. More particularly, the invention relates to a wide-band RF amplifying transceivers having multiple antenna elements.

BACKGROUND OF THE INVENTION

Radio frequency transceivers requiring wide frequency coverage or bandwidth along with high RF power levels encounter difficulties with bandwidth limitations of available power transistor amplifier technology. Higher power RF transistors are significantly more limited in bandwidth than are lower power RF transistors using available semiconductor technology.

One option to achieving simultaneous wide bandwidth and high power is to combine multiple RF transistor amplifiers having smaller bandwidths which are evenly spaced so as to cover the desired wide bandwidth with contiguous smaller bandwidth segments. A practical subset of this approach is the use of two amplifiers. One amplifier covers the lower half bandwidth and the other covers the higher half bandwidth to achieve full band coverage.

The primary limitation of such an approach is the requirement of high-power RF switches. These switches must select from one of two high-power RF energy signals and must be high-speed in order to support the frequency hopping rate of the transmission signal. The technology to perform this switching is currently limited to implementation with PIN semiconductor diodes (i.e. those diodes having a wide, undoped intrinsic semiconductor region between a P-type semiconductor and an N-type semiconductor region) to achieve the high-speed/high-power switching. Such diodes require high voltage bias and high-speed driver circuitry that adds considerable complexity and cost to the implementation. In addition, the switch contributes to a reduction in the transmitter power output due to resistive power dissipation.

Therefore, it would be desirable to provide a wideband RF amplifier capable of transceiving via multiple antenna elements having a simplified construction and enhanced power management capabilities.

SUMMARY OF THE INVENTION

Accordingly, the present invention is directed to an apparatus and a method for wideband amplification of RF signals.

In an embodiment of the invention, an apparatus for wideband amplification of RF transmissions may comprise: (a) a high-band amplifier; (b) a low-band amplifier; (c) a quadrature hybrid; and (d) a plurality of antennas.

In a further embodiment of the invention, an apparatus for wideband amplification of RF transmissions may comprise: (a) a plurality of high-band amplifiers; (b) a plurality of low-band amplifiers; (c) a high-band signal splitter; (d) a low-band signal splitter; (e) a first signal combination circuit, the first signal combination circuit comprising: (i) a first quadrature hybrid; (ii) a second quadrature hybrid; and (iii) a phase-shift controller; (f) a second signal combination circuit, the second signal combination circuit comprising: (i) a first quadrature hybrid; (ii) a second quadrature hybrid; and (iii) a phase-shift controller; and (g) a plurality of antennas.

In still a further embodiment of the invention, a method for wideband amplification of RF transmissions may comprise one or more of the following steps: (a) providing an RF signal; (b) amplifying at least one of a high-band portion of the RF signal or a low-band portion of the RF signal; (c) providing at least one of a first amplified high-band signal or a first amplified low-band signal as a first input to a first quadrature hybrid; (d) coupling a first output of the first quadrature hybrid to a first input of a second quadrature hybrid; (e) coupling a second output of the first quadrature hybrid to a second input of the second quadrature hybrid; and (f) coupling an output of the second quadrature hybrid to a first antenna.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

The following discussion is presented to enable a person skilled in the art to make and use the present teachings. Various modifications to the illustrated embodiments will be readily apparent to those skilled in the art, and the generic principles herein may be applied to other embodiments and applications without departing from the present teachings. Thus, the present teachings are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of the present teachings. Skilled artisans will recognize the examples provided herein have many useful alternatives and fall within the scope of the present teachings.

Reference will now be made, in detail, to presently preferred embodiments of the invention. Additional details of the invention are provided in the examples illustrated in the accompanying drawings.

Figure 1:
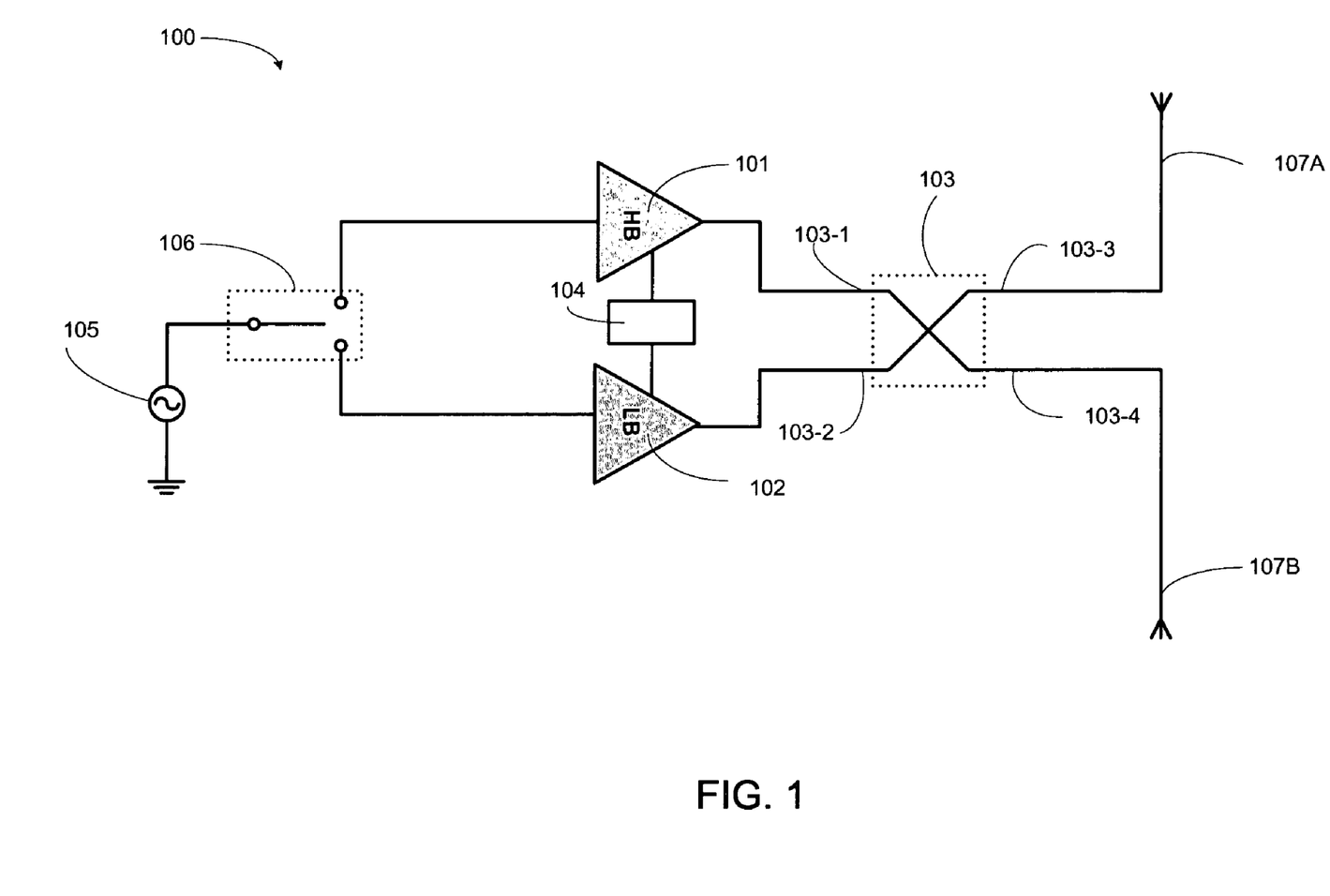
FIG. 1 depicts an apparatus for wideband amplification of RF signals in accordance with an embodiment of the present invention.

Referring to FIG. 1, a wideband amplifier 100 according to an embodiment of the present invention is presented. The wideband amplifier 100 may comprise one or more high-band amplifiers 101 and one or more low-band 102 amplifiers and a quadrature hybrid power divider 103. The quadrature hybrid 103 may comprise a network having four-ports; input ports 103-1 and 103-2 and output ports 103-3 and 103-4. Common quadrature hybrids are capable of operational ranges of from 10 kHz to 40 GHz. One function of a quadrature hybrid is to equally divide an input signal received at one of the two input ports into two −3 dB output signals while also imparting a 90° phase shift to one output signal with respect to the phase of the other output signal. Assuming no power is applied to port 103-2, a signal applied to port 103-1 splits equally between ports 103-3 and 103-4 with output 103-4 exhibiting a relative 90° phase shift. If ports 103-3 and 103-4 are properly terminated into matching impedances, nearly all of the signal power applied to port 103-1 is transmitted to the loads connected to ports 103-3 and 103-4. In this circumstance, port 103-2 receives negligible power and is termed "isolated". However, if there is an impedance mismatch at port 103-3, for example, then signal power reflected back from port 103-3 will be divided proportionally between ports 103-1 and 103-2.

Quadrature hybrids 103 commonly employ either lumped element circuits or stripline circuits. Using lumped element circuitry allows realizing microwave-type structures at frequencies as low as 10 kHz. Moreover, using lumped element circuits avoids the usual size penalties normally associated with circuits whose dimensions are closely related to wavelength.

In contrast, stripline circuit techniques are generally more useful at frequencies above 0.5 GHz and in applications requiring very low loss, high power, or both.

The outputs of the high-band amplifier 101 and low-band amplifier 102 are applied to ports 103-1 and 103-2, respectively, of the quadrature hybrid 103. As previously described, these two ports are isolated from each other due to the properties of the quadrature hybrid 103. Therefore, the amplifiers 101, 102 are isolated such that the loading of one amplifier will not affect the other amplifier.

Each amplifier 101, 102 may be alternately enabled by low level bias voltages from a bias controller 104 on the input of each stage of the amplifiers 101, 102. Enabling a particular amplifier involves applying a DC bias to the gate inputs of the amplifiers 101, 102. Similarly, disabling an amplifier involves applying a reverse bias to the gate inputs of the amplifiers 101, 102. In a particular embodiment, only one of either a high-band amplifier 101 or a low-band amplifier 102 is enabled for the duration a transmission on a particular frequency selected in a hopping sequence. The isolation of quadrature hybrid port 103-1 from quadrature hybrid port 103-2 ensures that a given amplifier is unaffected by the power condition (e.g. either "on" or "off" as dictated by the bias controller 104) of the other amplifier.

Figure 1A:
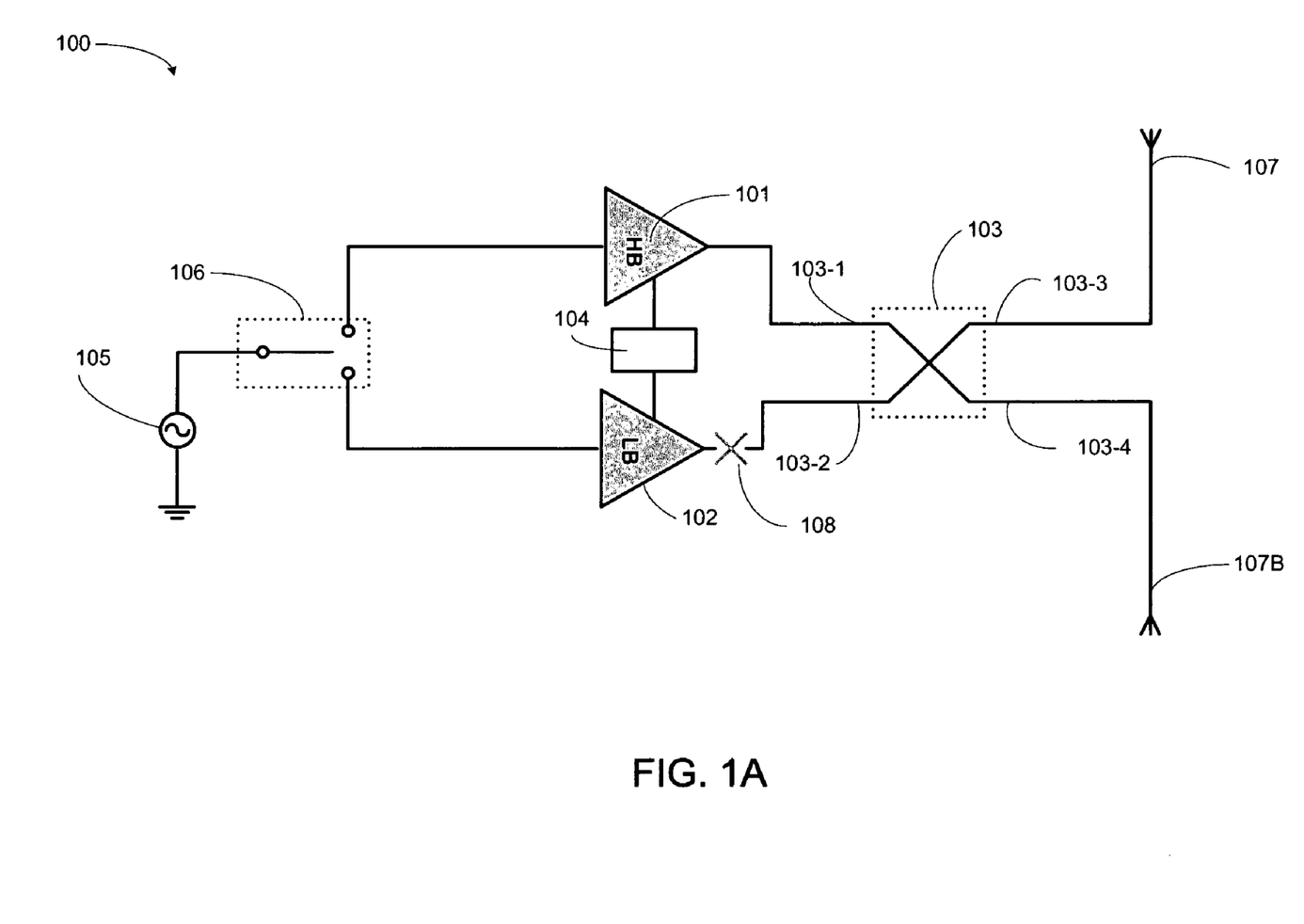
FIG. 1A depicts an apparatus for wideband amplification of RF signals in accordance with an embodiment of the present invention.

Referring to FIG. 1A, for example, if the low-band amplifier 102 is disabled 108, the RF power from the high-band amplifier 101 is directed to input 103-1 and is split equally between output ports 102-3 and 102-4 and, in turn, drives the antennas 107 connected to those output ports. Similarly, if the high-band amplifier 101 is disabled (not shown), the RF power from the low-band amplifier is routed to input 103-2 and is split equally between output ports 103-3 and 103-4 and, in turn, drives the antennas 107 connected to those output ports.

An obvious advantage of this approach over the prior art is the elimination of active, high-power switch circuitry and subsequent control circuitry, voltage generation, and amplifier selection logic required for selecting between the high and low bands. Further, any potential power losses associated with the switch circuitry are also eliminated. Additionally, quadrature hybrids 103 are capable of covering wide bandwidths covering both the high-band amplifier and low-band amplifier frequency ranges, removing the need for any additional switching between narrowband components of the prior art.

In a particular embodiment of the invention, the exciter input 105 may be routed to either the high-band amplifier 101 or low-band amplifier 102 with a low-power RF switch 106 implemented with semiconductor technology widely available and controlled by digital control signals. Incorporation of such low-power switches alleviates many of the high-power switching problems associated with conventional implementations of wideband amplifiers, as previously discussed.

Figure 2:
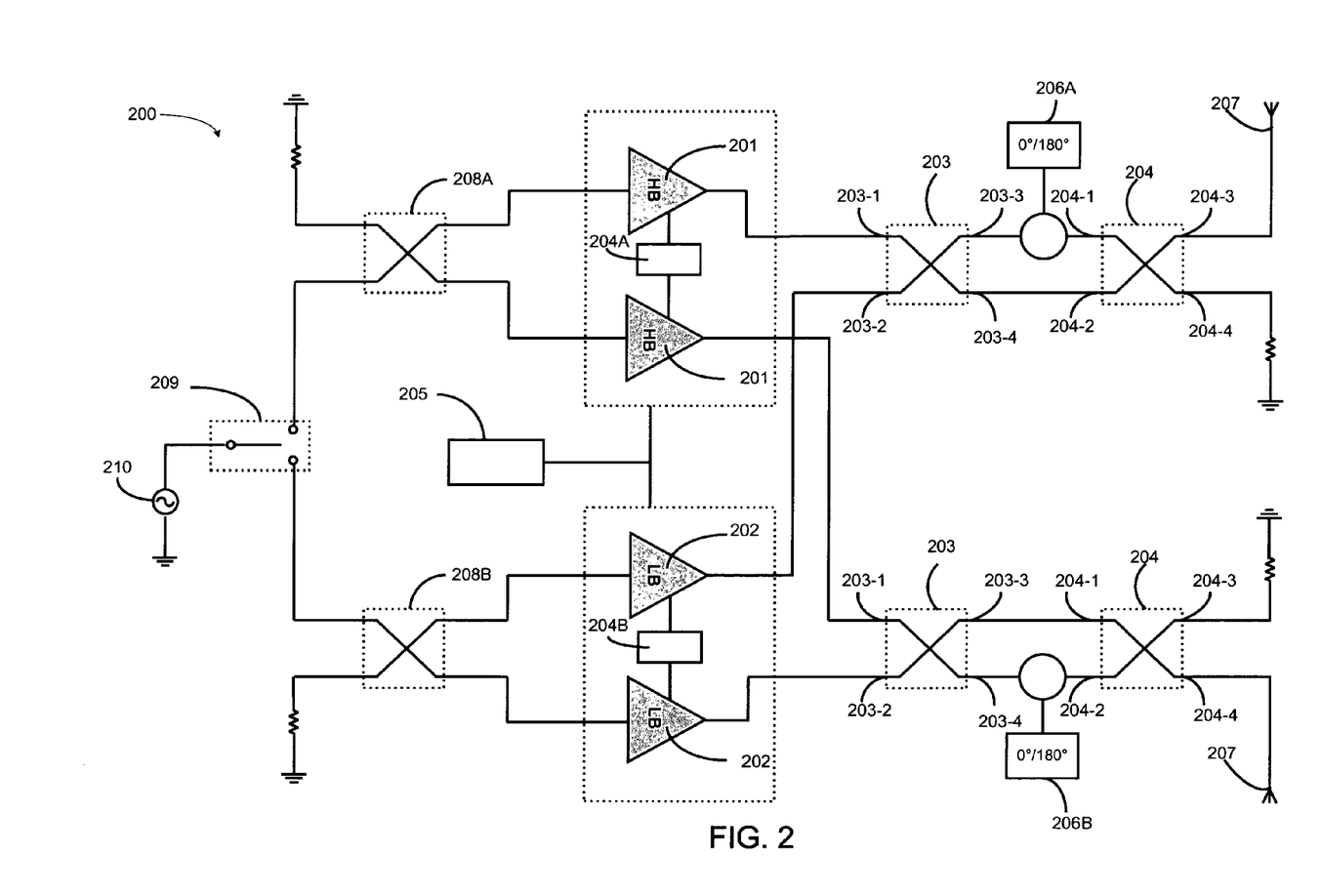
FIG. 2 depicts an apparatus for wideband amplification of RF signals in accordance with an embodiment of the present invention.

Referring to FIG. 2, an alternate implementation of the wideband amplifier transceiver architecture of the present invention is presented. Such an implementation extends the principles of operation of the wideband amplifier transceiver referred to above with respect to FIG. 1. The operation of the amplifier described with respect to FIG. 1 is to be employed where simultaneous transmission on a plurality of antennas is desired. However, it may also be desirable to provide functionality enabling the shutdown of one or more of the antennas of the plurality of antennas so as to conserve power if fewer than all of the plurality of antennas is required for certain transceiving conditions.

A complementary function of the quadrature hybrid is to combine two equal-amplitude, quadrature-phased input signals into a single output signal. In further embodiments, the present invention may employ a quadrature hybrid in both its combiner and splitter capacities simultaneously.

Referring to FIG. 2, a wideband RF amplifier 200 may comprise two or more high-band amplifiers 201 and two or more low-band amplifiers 202. In such an embodiment, the outputs 203-3 and 203-4 of the quadrature hybrids 203 are provided as inputs 204-1 and 204-2 to identical quadrature hybrids 204 so as to either provide phase synchronization in a dual-antenna configuration or to recombine high and low bands into a single signal for transmission via one antenna 207. It will be readily recognized that this architecture may be extended to any number of additional antennas 207 without departing from the scope of the invention.

The input transmission signal is provided by an exciter element 209 which is routed to either the plurality of high-band amplifiers 201 or the low-band amplifiers 202 by a low-power RF switch 210. The high-band and/or low-band signals may be distributed to the various high-band and/or low-band amplifiers 201, 202 by a splitter 208. In the depicted embodiment, the splitter comprises a quadrature hybrid resulting in a 90° phase shift between the high-band amplifier 201 outputs as well as between the respective low-band amplifier 202 outputs. However, any signal division element may be incorporated as the splitter 208, including common in-phase splitter elements, without departing from the scope of the invention.

In a multi-antenna transmission mode, drive circuitry 205 may be configured so as to select from transmitting via the plurality of high-band amplifiers 201 and/or the low-band amplifiers 202 depending on the desired frequencies of particular transmissions. Further, the wideband RF amplifier architecture 200 may comprise two-phase 0°/180° phase-shift controllers 206. The phase shift controllers 206 may be used to synchronize the phases of high-band and/or low-band signals for transmission via one or more antennas 207, as will be discussed below. The particular method of implementation of the phase shifter is not essential to this architecture. Several methods can be applied such as selectable transmission line lengths or switched discrete components.

Figure 2A:
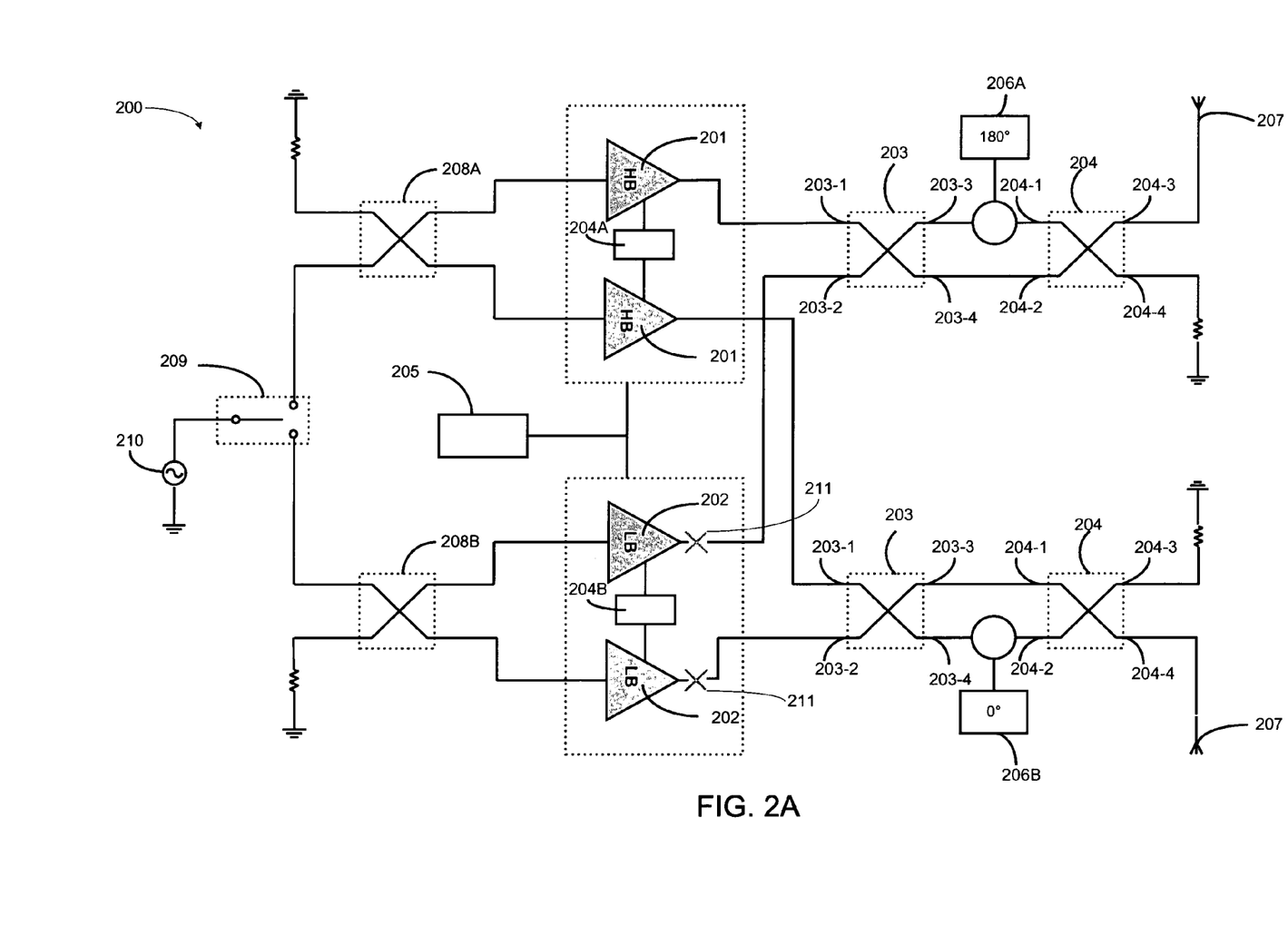
FIG. 2A depicts an apparatus for wideband amplification of RF signals in accordance with an embodiment of the present invention.

Referring to FIG. 2A, a first mode of operation of the wideband RF architecture 200 is presented. In this mode, both high-band amplifiers 201 are enabled by DC bias from a high-band bias controller 208A as well as by the RF drive circuitry 205 (while low-band amplifiers 202 are disabled 211) to transmit into the upper antenna 207A and lower antenna 207B simultaneously. The upper phase shift controller 206A is set to 1800 and the lower phase shift controller 206B is set to 0° for correct combining operations.

Similarly, in a second mode of operation (not shown), both low-band amplifiers 202 are enabled by DC bias from low-band bias controller 208B as well as by the RF drive circuitry 205 (while high-band amplifiers 201 are disabled) to transmit into the upper antenna 207A and lower antenna 207B simultaneously. The upper phase shift controller 206A is set to 0° and the lower phase shift controller 206B is set to 180° for correct combining operations.

Figure 2B:
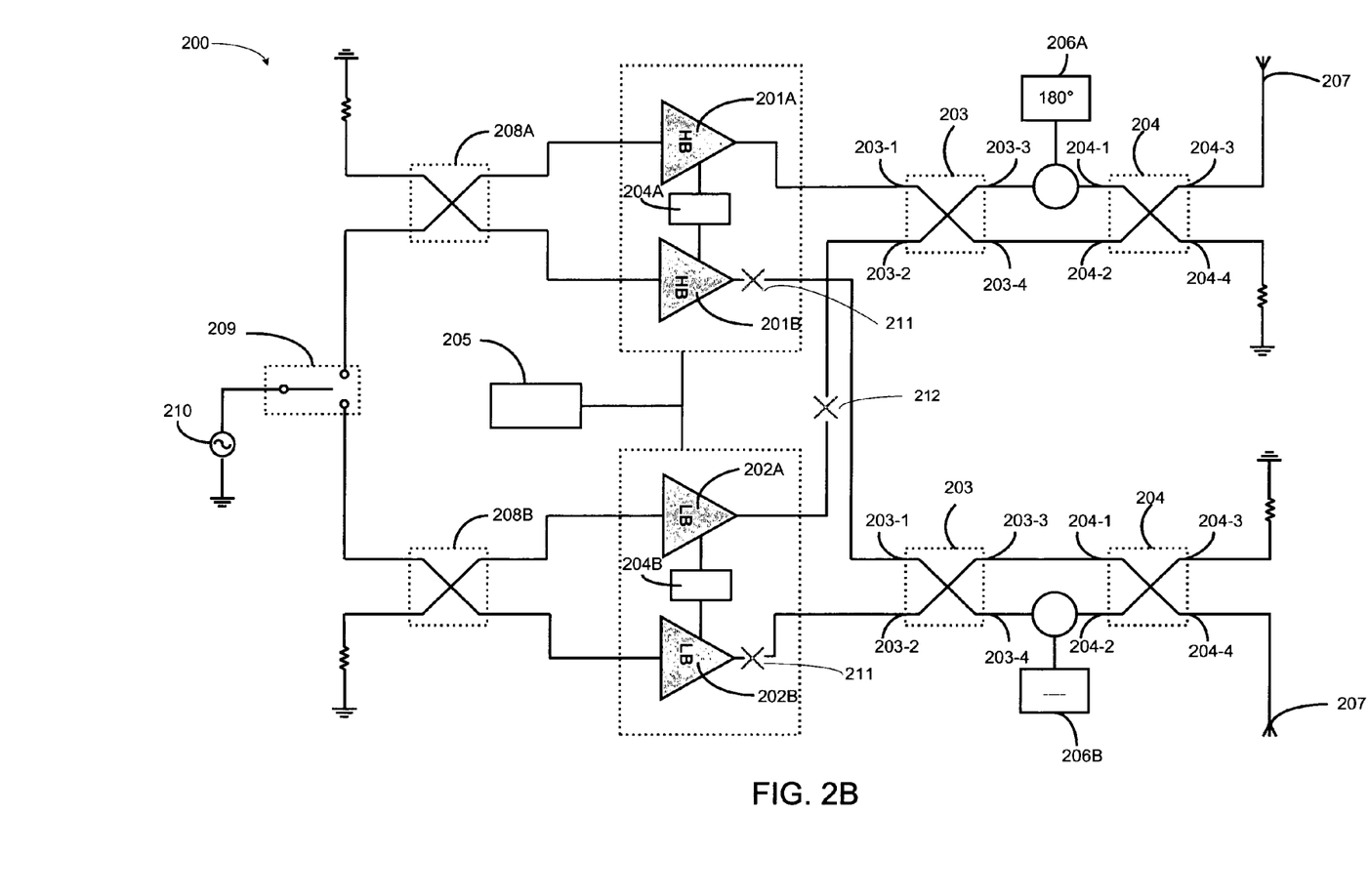
FIG. 2B depicts an apparatus for wideband amplification of RF signals in accordance with an embodiment of the present invention.

Referring to FIG. 2B, a third mode of operation of the wideband amplifier architecture 200 is presented. In this mode, a high-band amplifier 201A and a low-band amplifier 202A are enabled by DC bias from high-band bias controller 208A and low-band bias controller 208B respectively (while high-band amplifier 201B and low-band amplifier 202B are disabled 211) to transmit into the upper antenna 207A only. Such a configuration effectively disables transmission on the lower antenna 207B, thereby avoiding unwanted power usage. In a further embodiment, the RF drive circuitry 205 may enable the high-band amplifiers 201 while disabling 212 the low-band amplifiers 202. As such, only the output of a single high-band amplifier 201A is provided to the upper antenna 207A, thereby providing additional power conservation when only a particular sub-band is required. In such a case, a 180° phase shift 206A would be required for proper combining of the high-band amplifier 201A output. In still a further embodiment (not shown), the RF drive circuitry 205 may disable the high-band amplifiers 201 while enabling the low-band amplifiers 202 thereby providing a low-band amplifier 202A signal to antenna 207A. In such a case, no phase shift 206A would be required for proper combining of the low-band amplifier 202A output.

Similarly, in a fourth mode of operation (not shown), a high-band amplifier 201B and a low-band amplifier 202B are enabled with DC bias from high-band bias controller 208A and low-band bias controller 208B respectively (while high-band amplifier 201A and low-band amplifier 202A are disabled) to transmit into the lower antenna 207B only. Such a configuration effectively disables transmission on the upper antenna 207A, thereby avoiding unwanted power usage. In a further embodiment, the RF drive circuitry 205 may enable the high-band amplifiers 201 while disabling the low-band amplifiers 202. As such, only the output of a single high-band amplifier 201B is provided to the lower antenna 207B, thereby providing additional power conservation when only a particular sub-band is required. In such a case, no phase shift 206B would be required for proper combining of the high-band amplifier 201B output. Alternately, the RF drive circuitry 205 may disable the high-band amplifiers 201 while enabling the low-band amplifiers 202 thereby providing a low-band amplifier 202B signal to antenna 207B. In such a case, a 180° phase shift 206B would be required for proper combining of the low-band amplifier 202B output.

Figure 3:
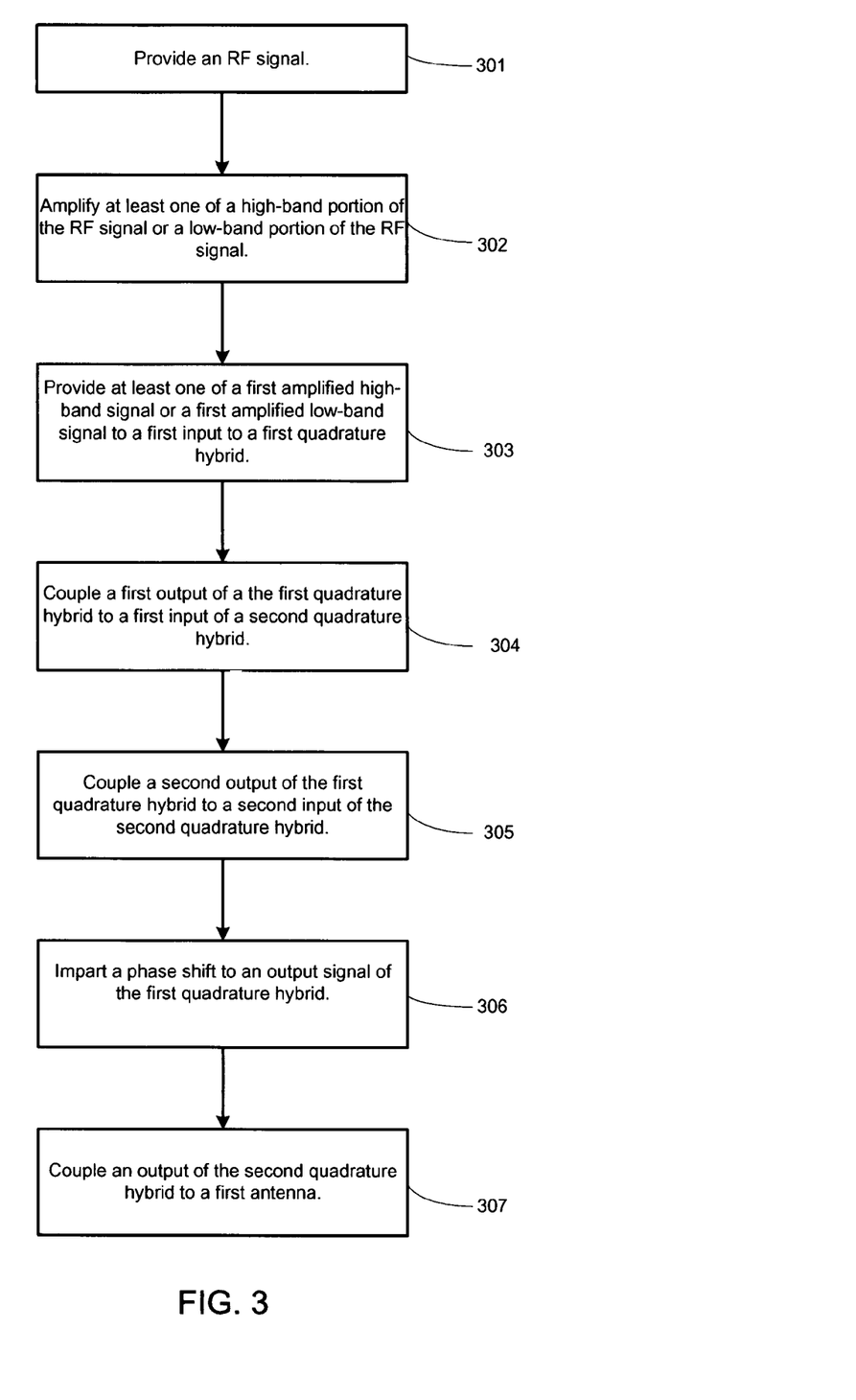
FIG. 3 presents a process flow diagram for a method for wideband amplification of RF signals.

Referring to FIG. 3, a process flow diagram for a method of wideband RF signal amplification is presented. A wideband RF signal may be provided at step 301. The wideband RF signal may be routed to multiple sub-band amplifiers, each amplifier being configured to amplify RF signals in a given frequency range of the wideband RF signal. One or more of the sub-band amplifiers may amplify signals in a high-band frequency range while other sub-band amplifiers may amplify signals in a low-band frequency range at step 302.

One or more of the high-band and/or low-band RF outputs from the sub-band amplifiers may be provided to an input of a first quadrature hybrid at step 303. The identity of the high-band and/or low-band amplifier outputs which are routed to the quadrature hybrid may be determined by one or more amplifier bias controllers. In a particular embodiment, a first bias controller may enable one or more high-band amplifiers and a second bias controller may enable one or more low-band amplifiers. In still a further embodiment, RF drive circuitry may enable the high-band and/or low-band amplifier blocks.

In a further embodiment, a second high-band and/or low-band RF amplifier output may be provided to a second input to the first quadrature hybrid input at step 303. The quadrature hybrid may operate to combine a high-band RF signal and a low-band RF signal into a single output from the quadrature hybrid.

First and second outputs from the first quadrature hybrid may be coupled, respectively, to first and second inputs of a second quadrature hybrid at steps 304 and 305. The second quadrature hybrid may serve to sum signal elements to produce an in-phase output from the second quadrature hybrid. In particular embodiments, an output of the first quadrature hybrid may require a phase-shift at step 306 so as to ensure proper signal combining.

Finally, an output of the second quadrature hybrid may be coupled to an antenna structure so as to transmit high-band, low-band or wideband RF signals at step 307.

It is believed that the present invention and many of its attendant advantages will be understood from the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An apparatus for wideband amplification or RF signals, the apparatus comprising:
   a plurality of high-band amplifiers;
   a plurality of low-band amplifiers;
   a high-band signal splitter;
   a low-band signal splitter;
   a first signal combination circuit, the first signal combination circuit comprising:
      a first quadrature hybrid;
      a second quadrature hybrid; and
      a phase-shift controller;
   a second signal combination circuit, the second signal combination circuit comprising:
      a first quadrature hybrid;
      a second quadrature hybrid; and
      a phase-shift controller; and
   a plurality of antennas.

2. The apparatus of claim 1,
   wherein an output of a high-band amplifier of the plurality of high-band amplifiers is coupled to an input of the first quadrature hybrid of the first signal combination circuit;

wherein an output of a high-band amplifier of the plurality of high-band amplifiers is coupled to an input of the first quadrature hybrid of the second signal combination circuit;

wherein an output of a low-band amplifier of the plurality of low-band amplifiers is coupled to an input of the first quadrature hybrid of the first signal combination circuit; and wherein an output of a low-band amplifier of the plurality of low-band amplifiers is coupled to an input of the first quadrature hybrid of the second signal combination circuit.

3. The apparatus of claim 1,
wherein outputs of the first quadrature hybrid of the first combiner circuit are coupled to inputs of the second quadrature hybrid of the first combiner circuit; and
wherein outputs of the first quadrature hybrid of the second combiner circuit are coupled to inputs of the second quadrature hybrid of the second combiner circuit.

4. The apparatus of claim 3,
wherein a first phase shift controller is disposed between an output of the first quadrature hybrid of the first combiner circuit and an input of the second quadrature hybrid of the first combiner circuit; and
wherein a second phase shift controller is disposed between an output of the first quadrature hybrid of the second combiner circuit and an input of the second quadrature hybrid of the second combiner circuit.

5. The apparatus of claim 1,
wherein an output of the second quadrature hybrid of the first combiner circuit is coupled to a first antenna of the plurality of antennas; and
wherein an output of the second quadrature hybrid of the second combiner circuit is coupled to an second antenna of the plurality of antennas.

6. The apparatus of claim 1,
further comprising:
  a high-band bias-controller; and
  a low-band bias-controller,
wherein the high-band bias-controller enables at least one of a first high-band amplifier or a second high-band amplifier of the plurality of high-band amplifiers, and
wherein the low-band bias-controller enables at least one of a first low-band amplifier or a second low-band amplifier of the plurality of low-band amplifiers.

7. The apparatus of claim 1,
further comprising:
  RF drive circuitry,
wherein the RF drive circuitry enables at least one of the plurality of high-band amplifiers or the plurality of low-band amplifiers.

8. The apparatus of claim 1,
further comprising:
  an RF signal generator; and
  a low-power RF switch,
wherein the low-power RF switch routes an RF signal from the signal generator to either the plurality of high-band amplifiers or the plurality of low-band amplifiers.

9. The apparatus of claim 8,
further comprising:
  a high-band RF splitter; and
  a low-band RF splitter,
wherein the RF splitter distributes the RF signal among the plurality of high-band amplifiers, and
wherein the low-band RF splitter distributes the RF signal among the plurality of low-band amplifiers.

10. The apparatus of claim 9,
wherein the high-band RF splitter and low-band RF splitter comprise quadrature hybrids.

11. A method for wideband amplification of RF signals, the method comprising the steps:
  providing an RF signal;
  amplifying at least one of a high-band portion of the RF signal or a low-band portion of the RF signal;
  providing at least one of a first amplified high-band signal or a first amplified low-band signal as a first input to a first quadrature hybrid;
  coupling a first output of the first quadrature hybrid to a first input of a second quadrature hybrid;
  coupling a second output of the first quadrature hybrid to a second input of the second quadrature hybrid; and
  coupling an output of the second quadrature hybrid to a first antenna.

12. The method of claim 11,
further comprising the step:
  imparting a phase shift to an output signal of the first quadrature hybrid.

13. The method of claim 11,
further comprising the steps:
  providing at least one of a second amplified high-band signal or a second amplified low-band signal as a first input to a third quadrature hybrid;
  coupling a first output of the third quadrature hybrid to a first input of a fourth quadrature hybrid;
  coupling a second output of the third quadrature hybrid to a second input of the fourth quadrature hybrid;
  coupling an output of the fourth quadrature hybrid to a second antenna.

14. The method of claim 13,
further comprising the step:
  imparting a phase shift to an output signal of the third quadrature hybrid.

15. The method of claim 13,
further comprising the step:
  providing at least one of a second amplified high-band signal or a second amplified low-band signal as a second input to the first quadrature hybrid.

16. The method of claim 13,
further comprising the step:
  providing at least one of a second amplified high-band signal or a second amplified low-band signal as a second input to the third quadrature hybrid.

* * * * *